US006586162B2

(12) United States Patent
Lee (10) Patent No.: US 6,586,162 B2
(45) Date of Patent: Jul. 1, 2003

(54) SIMPLE PHOTO DEVELOPMENT STEP TO FORM TISI$_X$ GATE IN DRAM PROCESS (75) Inventor: Yu-Hua Lee, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 187 days.

(21) Appl. No.: 09/729,624

(22) Filed: Dec. 1, 2000

(65) Prior Publication Data
US 2001/0018165 A1 Aug. 30, 2001

Related U.S. Application Data (63) Continuation-in-part of application No. 09/035,050, filed on Mar. 5, 1998, now abandoned.

(51) Int. Cl.[7] .................................................. G03F 7/00
(52) U.S. Cl. ..................... 430/316; 430/317; 430/313; 216/46
(58) Field of Search ................................. 430/312, 313, 430/314, 316, 317; 216/46; 438/754, 755, 756

(56) References Cited

U.S. PATENT DOCUMENTS

| 4,702,993 A | | 10/1987 | White et al. ................ 430/296 |
| 5,166,771 A | * | 11/1992 | Godinho .................... 257/368 |
| 5,486,424 A | | 1/1996 | Nakato et al. ............... 428/451 |
| 5,547,812 A | | 8/1996 | Collins et al. ............. 430/270.1 |
| 5,597,983 A | | 1/1997 | Nguyen et al. .............. 174/264 |
| 5,747,373 A | * | 5/1998 | Yu ............................. 438/305 |
| 5,759,886 A | * | 6/1998 | Chung ........................ 438/231 |
| 5,818,092 A | * | 10/1998 | Bai ............................. 257/388 |
| 5,844,284 A | * | 12/1998 | Liu ............................. 257/382 |
| 5,863,820 A | * | 1/1999 | Huang ........................ 438/241 |

* cited by examiner

Primary Examiner—Kathleen Duda
(74) Attorney, Agent, or Firm—George O. Saile; Stephen B. Ackerman; Rosemary L. S. Pike (57) ABSTRACT A method of using resist planarization to prepare for silicidation while protecting silicon nitride spacers in the fabrication of integrated circuits is described. Field oxide areas are formed on a semiconductor substrate surrounding and electrically isolating a logic device area and a memory device area. Polysilicon gate electrodes having silicon nitride sidewall spacers and associated source/drain regions are formed in the device areas. A silicon oxide layer is deposited overlying the gate electrodes and source/drain regions. The silicon oxide layer is covered with a photoresist layer. The photoresist layer is developed until the silicon oxide layer overlying the gate electrodes is exposed and the photoresist layer is below the tops of the gate electrodes. The exposed silicon oxide layer is etched away whereby the tops of the gate electrodes are exposed and wherein the silicon nitride spacers are undamaged by the etching. All of the silicon oxide layer in the logic device area is etched away. A layer of titanium is deposited over the semiconductor substrate which is annealed to transform the titanium layer into a titanium silicide layer over the gate electrodes and over the source/drain regions in the logic area. The unreacted titanium layer is removed to leave the titanium silicide layer only on the top surface of the gate electrodes and on the top surface of the semiconductor substrate overlying the source/drain regions associated with the gate electrodes in the logic device area.

21 Claims, 6 Drawing Sheets

SIMPLE PHOTO DEVELOPMENT STEP TO FORM TISI$_X$ GATE IN DRAM PROCESS

This application is a continuation-in-part of Ser. No. 09/035,050, filed Mar. 5, 1998, assigned to a common assignee, now abandoned.

BACKGROUND OF THE INVENTION (1) Field of the Invention

The present invention relates to the fabrication of integrated circuit devices, and more particularly, to a method of improving the salicide formation process in the fabrication of integrated circuits.

(2) Description of the Prior Art

In the fabrication of embedded dynamic random ad access memory (EDRAM) integrated circuit devices, logic and memory devices are fabricated on the same chip. Logic devices are often produced using salicide (self-aligned silicide) processes in order to obtain higher circuit performance. In silicidation, a refractory metal layer is deposited and then annealed. The underlying silicon reacts with the refractory metal layer to produce a silicide overlying the gate electrode and source and drain regions. The silicided gate and source/drain regions have lower resistance than non-silicided regions, especially in smaller geometries, and hence, higher circuit performance. In memory devices, silicide is used only on the gate regions, not on the source and drain regions because of junction leakage problems.

In preparing for silicidation, the areas not to be silicided, such as the source/drain regions in the memory areas, must be protected while the areas to be silicided are exposed. In the conventional process, silicon nitride spacers are formed on the sidewalls of the gate electrodes in order to prevent source/drain to gate bridging after silicidation. A barrier and anti-reflective coating (BARC) layer is deposited over the gate electrodes followed by a layer of photoresist. The photoresist is patterned and then etched back using a dry etching process to expose the areas to be silicided. However, because of poor etching selectivity, the silicon nitride spacers are damaged by the etch back process. This leads to source/drain to gate bridging of the salicide. It is desired to prevent damage to the silicon nitride spacers during patterning for silicidation.

U.S. Pat. No. 5,486,424 to Nakato et al teaches a method of forming a silylated photoresist layer and etching it back. U.S. Pat. No. 4,702,993 to White et al shows treatment of a polyimide planarizing layer underlying an electron beam resist. U.S. Pat. No. 5,547,812 to Collins et al discusses the use of the resist developer trimethylammonium hydroxide (TMAH) as the industry standard. U.S. Pat. No. 5,597,983 to Nguyen et al teaches the use of TMAH in removing polymer buildup within a via.

SUMMARY OF THE INVENTION

Accordingly, it is a primary object of the present invention to provide an effective and very manufacturable method of silicidation in the fabrication of integrated circuits.

It is a further object of the invention to provide a process for resist planarization in the formation of a silicidated gate in the fabrication of integrated circuits.

Yet another object is to use resist planarization to prepare to form salicided gate and source/drain regions in the logic circuits of an integrated circuit device.

Yet another object is to use resist planarization to prepare to form salicided gate and source/drain regions in the logic circuits of an embedded memory integrated circuit device while protecting areas within the memory circuits that are not to be silicided.

A still further object of the invention is to use resist planarization to prepare to form salicided gate and source/drain regions in the logic circuits of an integrated circuit device wherein silicon nitride spacers are not damaged.

In accordance with the objects of the invention, a method of using resist planarization to prepare for silicidation while protecting silicon nitride spacers in the fabrication of integrated circuits is achieved. Field oxide areas are formed on a semiconductor substrate surrounding and electrically isolating a logic device area and a memory device area. Polysilicon gate electrodes and associated source/drain regions are formed in the device areas. Silicon nitride spacers are formed on the sidewalls of the polysilicon gate electrodes. A silicon oxide layer is deposited overlying the polysilicon gate electrodes and source/drain regions. The silicon oxide layer is covered with a photoresist layer. The photoresist layer is developed until the silicon oxide layer overlying the polysilicon gate electrodes is exposed and the photoresist layer is below the tops of the polysilicon gate electrodes. The exposed silicon oxide layer is etched away whereby the tops of the polysilicon gate electrodes are exposed and wherein the silicon nitride spacers are undamaged by the etching. The photoresist layer is removed. A photoresist mask is formed covering the memory device area. All of the silicon oxide layer not covered by the photoresist mask in the logic device area is etched away and the photoresist mask is removed. Thereafter, a layer of titanium is deposited over the semiconductor substrate. The semiconductor substrate is annealed whereby the titanium layer is transformed into a titanium silicide layer over the gate electrodes and over the source/drain regions in the logic area not covered by the silicon oxide layer. The unreacted titanium layer overlying the spacers, field oxide regions, and silicon oxide layer is removed to leave the titanium silicide layer only on the top surface of the gate electrodes and on the top surface of the semiconductor substrate overlying the source/drain regions associated with the gate electrodes in the logic device area to complete fabrication of the integrated circuit device.

BRIEF DESCRIPTION OF THE DRAWINGS

In the accompanying drawings forming a material part of this description, there is shown.

DESCRIPTION OF THE PREFERRED EMBODIMENTS

Figure 1:
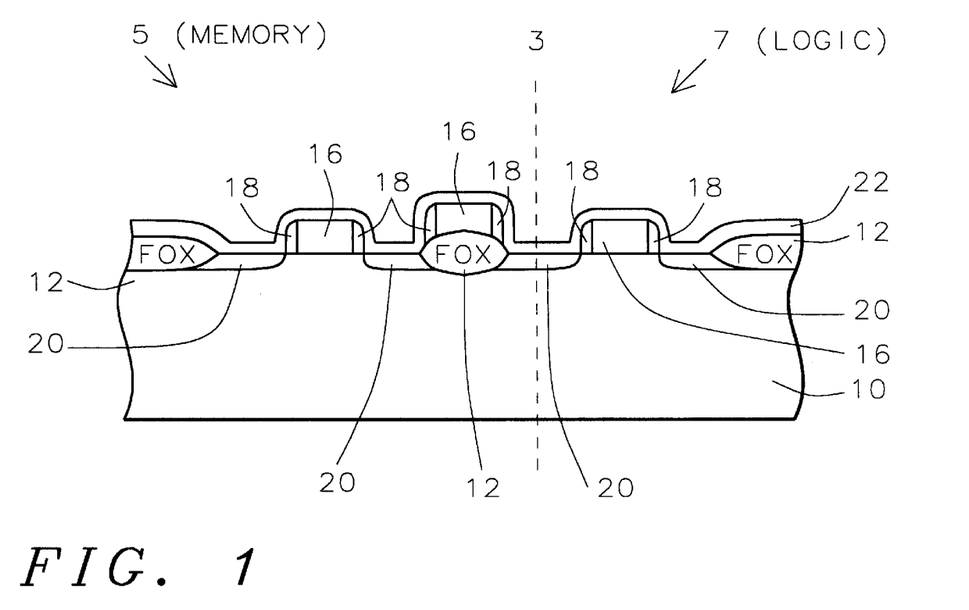
FIGS. 1 through 10 are cross-sectional representations of a preferred embodiment of the present invention.

Referring now more particularly to FIG. 1, there is shown a semiconductor substrate 10, preferably composed of monocrystalline silicon. Field OXide regions 12 may be formed as is conventional in the art. The substrate is shown to be divided by dashed line 3 into a memory side 5 on the left and a logic side 7 on the right. The chip is depicted in this way for clarity. It is to be understood that the chip layout can be other than that depicted. The important point is that both logic and memory devices are to be fabricated on the same wafer.

It should be understood that the process of the present invention can be used in any application in which it is desired to protect from etching damage a nitride layer underlying an oxide layer, such as the silicon nitride spacers of the preferred embodiment described here, but not limited to that embodiment.

Polysilicon gate electrodes 16 are formed as is conventional in the art in both the memory and logic areas of the integrated circuit. Silicon nitride spacers 18 are formed on the sidewalls of the gate electrodes, as is conventional. Source and drain regions 20 are formed within the semiconductor substrate and doped as is appropriate to form either N+ or P+ source/drain regions. A conformal layer of silicon dioxide 22 is deposited over the semiconductor devices structures to a thickness of between about 200 and 500 Angstroms. The silicon dioxide layer serves as a protective oxide film.

Figure 2:
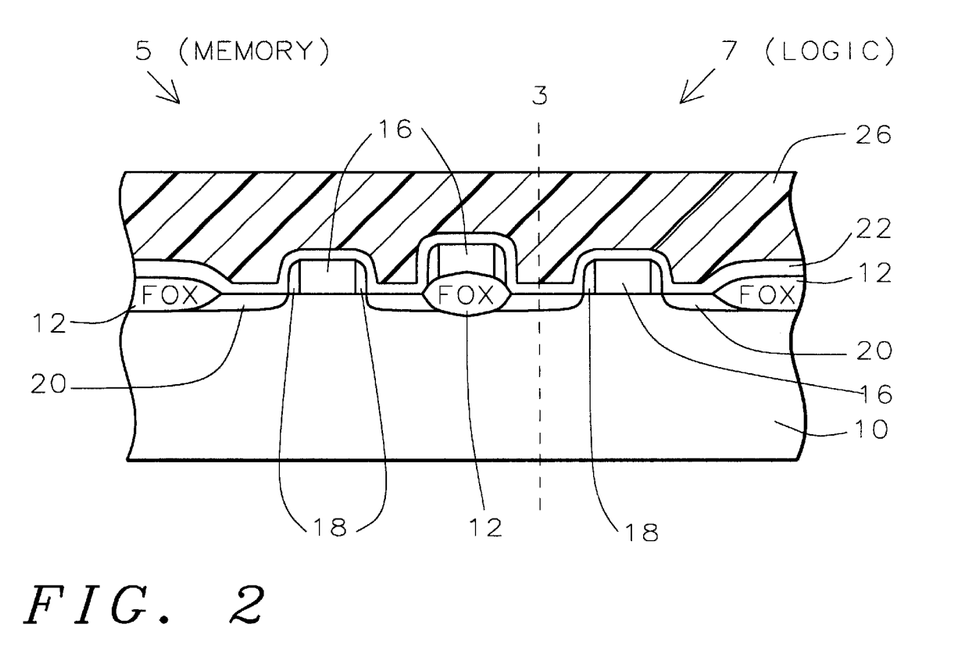

Referring now to FIG. 2, the key feature of the present invention will be described. A layer of photoresist 26 is coated over the substrate to a thickness of between about 1300 Angstroms over the top of the gate electrode 16 and about 2700 Angstroms over the source/drain regions. The thickness of the photoresist layer over the highest semiconductor device structure is more than about 400 Angstroms.

In order to prepare the chip for silicidation, the protective oxide layer 22 overlying the gate electrodes must be removed. The protective oxide layer is also to be removed overlying the source and drain regions only within the logic area 7. In order to prevent bridging during silicidation of the logic circuits, the silicon nitride spacers must remain undamaged. The protective oxide layer will protect the silicon nitride spacers from damage.

Figure 3:
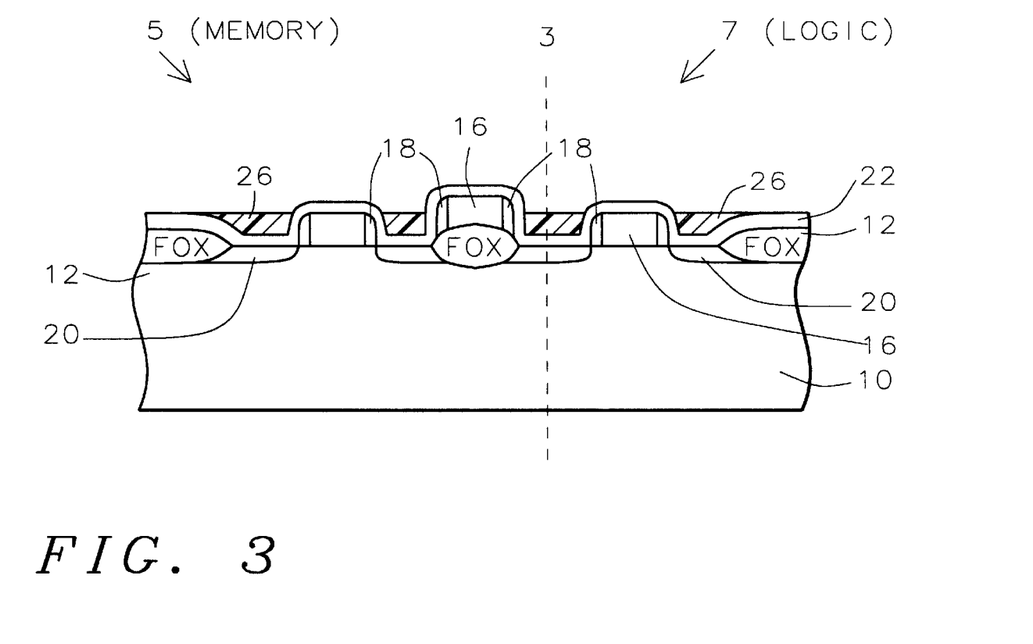

The photoresist layer 26 is developed, using, for example trimethylammonium hydroxide (TMAH). FIG. 3 illustrates the wafer after the photoresist has been partially developed away. The photoresist must be removed over the top surface of the gate electrodes. For example, approximately 1000 Angstroms of a 1300 Angstrom photoresist coating may be removed.

Figure 4:
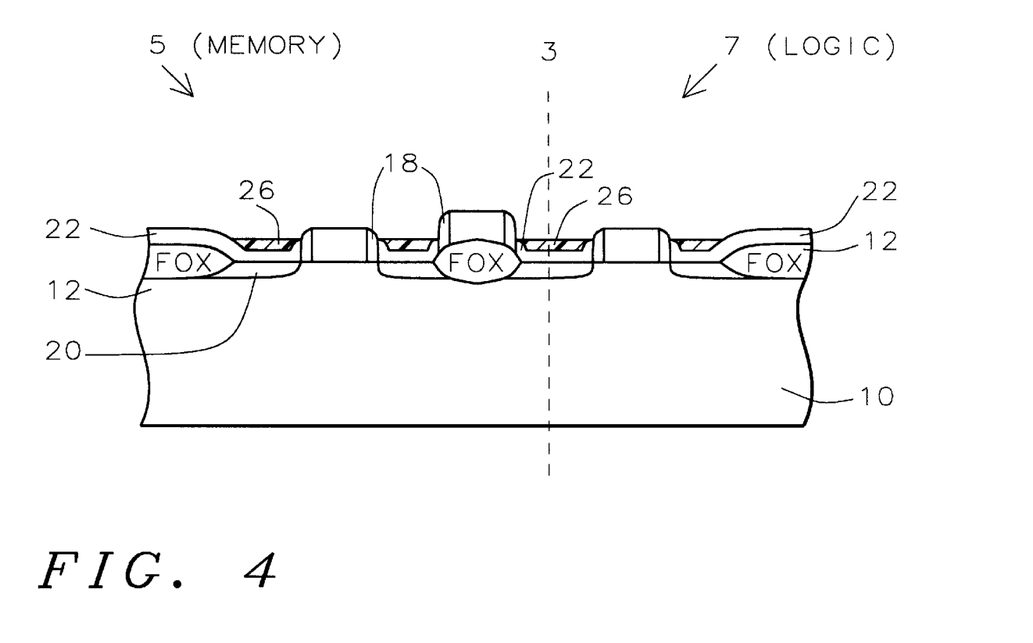
Figure 5:
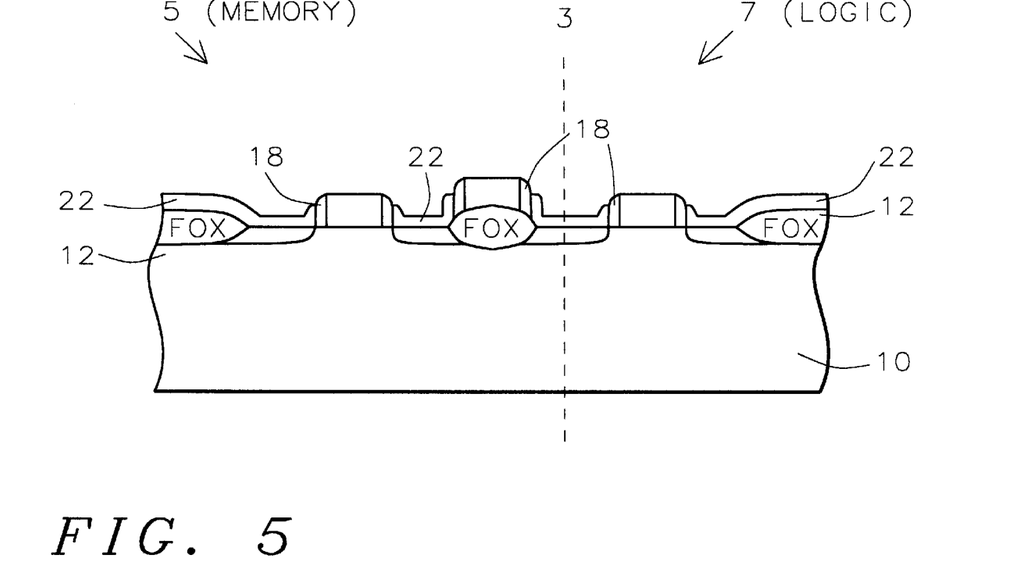

Referring now to FIG. 4, the exposed oxide layer 22 is etched away using a wet etch process, such as a buffered oxide etch (BOE) or hydrofluoric acid (HF). As shown in FIG. 5, the remaining photoresist 26 is stripped.

In the prior art method of photolithographic masking and dry etching of the oxide layer 22, the silicon nitride spacers 18 would be damaged because of the poor etch selectivity of oxide with respect to silicon nitride. However, in the process of the present invention, wherein photoresist covers the portions of the substrate not to be etched and wherein the exposed oxide is etched away using a wet etch, the silicon nitride spacers are undamaged. The development process is less costly than dry etching and can be controlled more easily.

Figure 6:
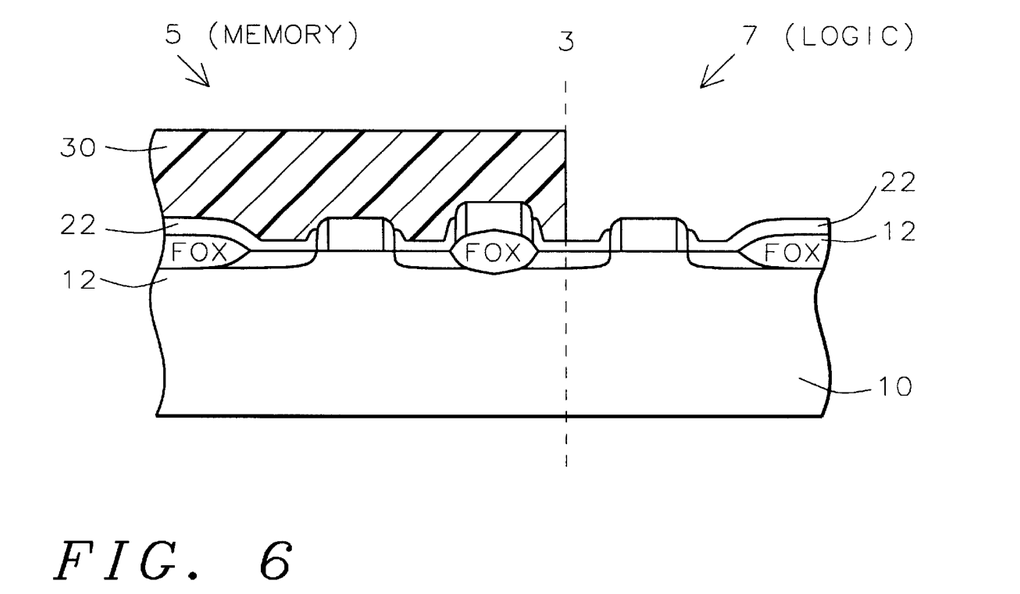
Figure 7:
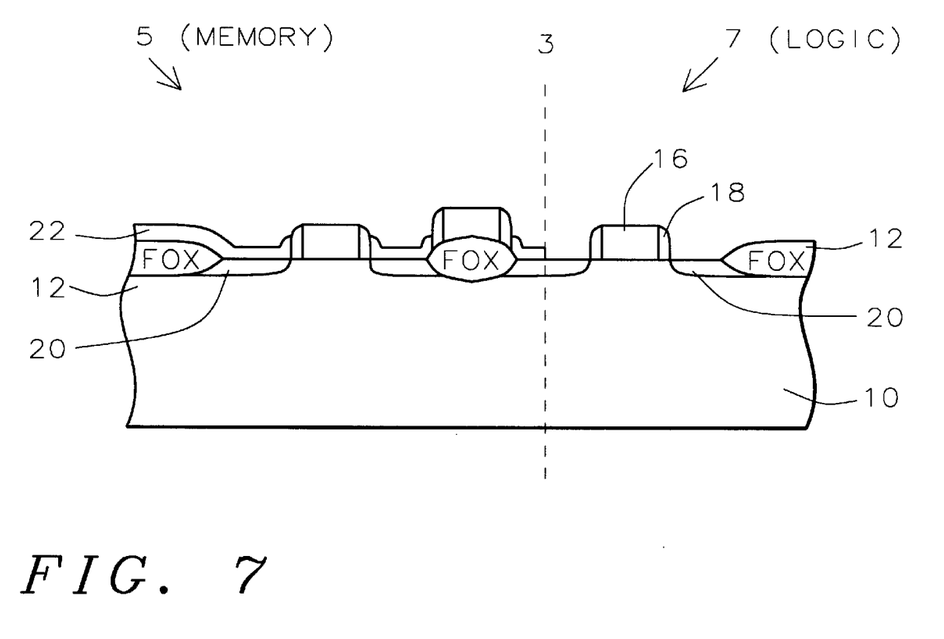
Figure 8:
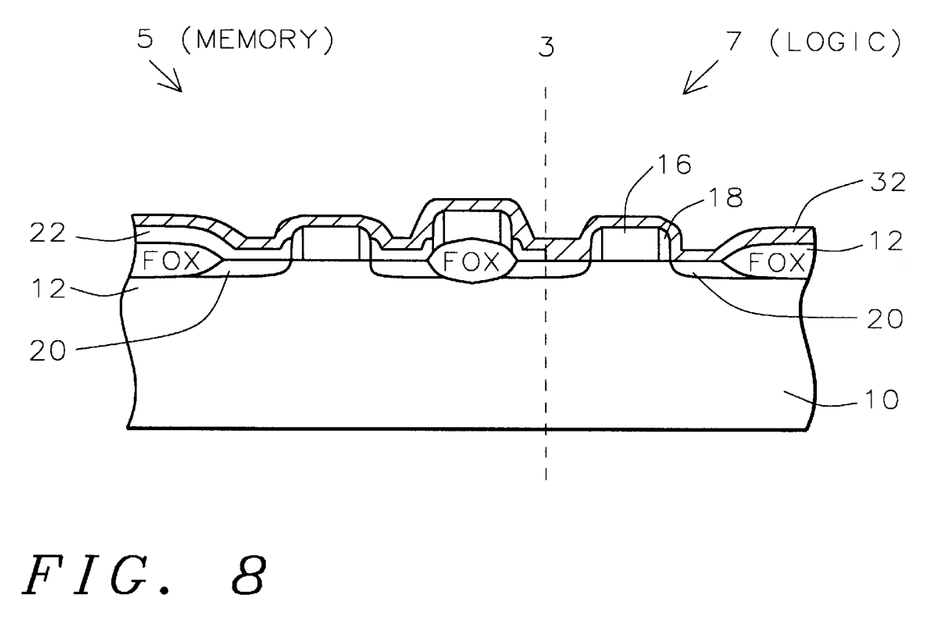

Referring now to FIG. 6, a photoresist mask 30 is formed over the substrate to protect the memory devices. The protective oxide layer 22 remaining in the logic area is completely removed by wet etching, as shown in FIG. 7. The wafer is ready for silicidation. Only the gate electrodes are exposed on the memory side 5. On the logic side, both the gate electrode and the source/drain regions are exposed. Referring now to FIG. 8, a layer 32 of titanium, titanium nitride, titanium/titanium nitride,, or the like, is deposited over the surface of the substrate, typically by sputtering.

Figure 9:
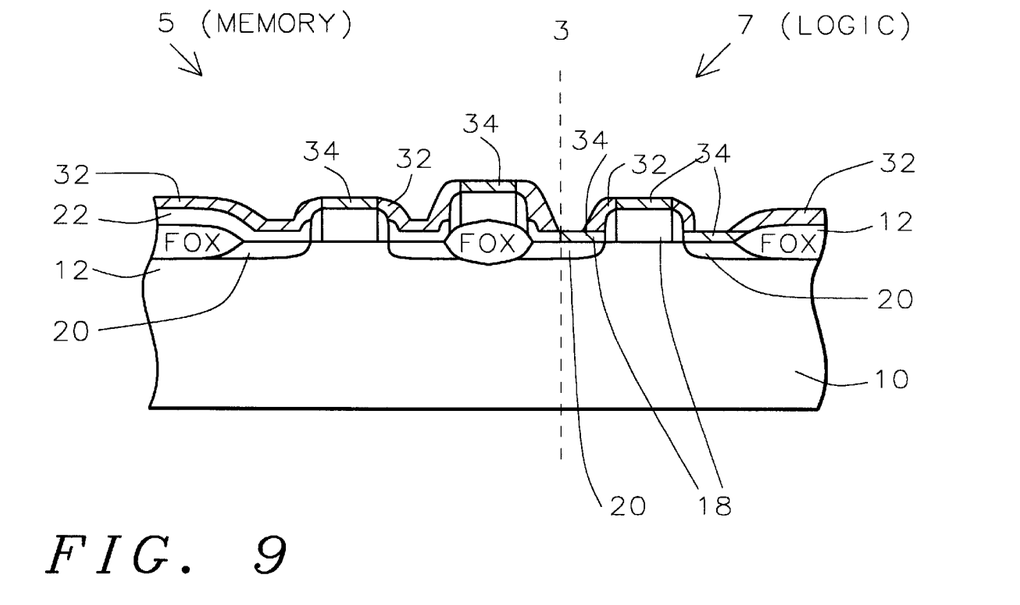

The substrate is annealed, for example, using a rapid thermal anneal (RTA) in a nitrogen ambient at a temperature of 750 to 850° C. for 20 to 40 seconds. The titanium layer 32 reacts with the silicon in the substrate in the source and drain regions 20 on the logic side 7 and with the plolysilicon in the gate electrodes 16 to form titanium silicide 34. The titanium overlying the field oxide regions 12, the silicon nitride sidewalls 18, and the oxide layer 22 is unchanged, as illustrated in FIG. 9.

Figure 10:
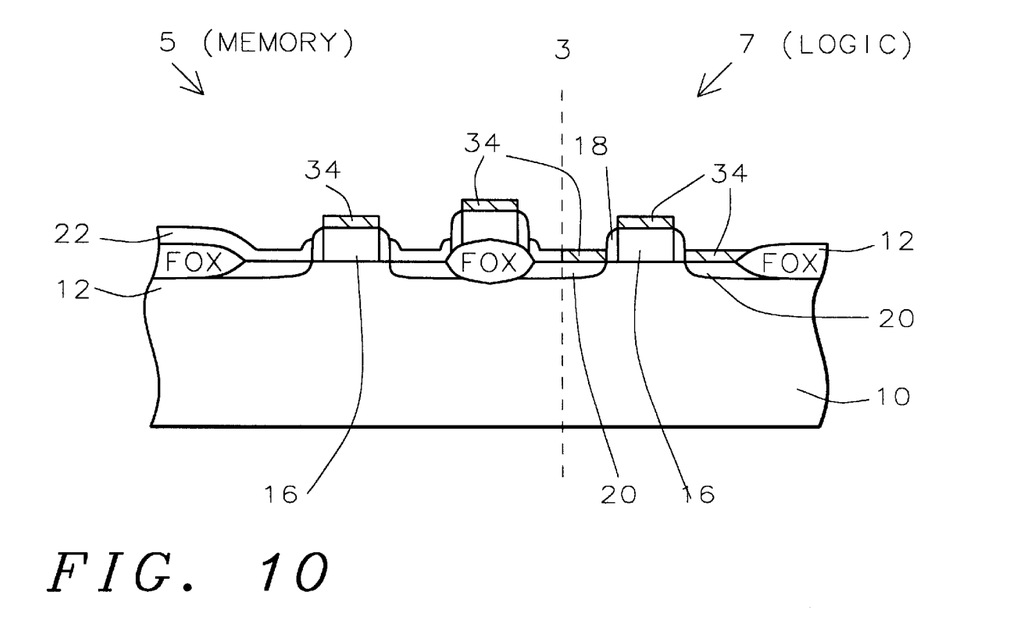

Referring now to. FIG. 10, the unreacted titanium 32 is removed, leaving the salicided gate electrodes 16 and source and drain regions 20 in the logic area 7 and the salicided gate electrodes 16 in the memory area 5.

Figure 11:
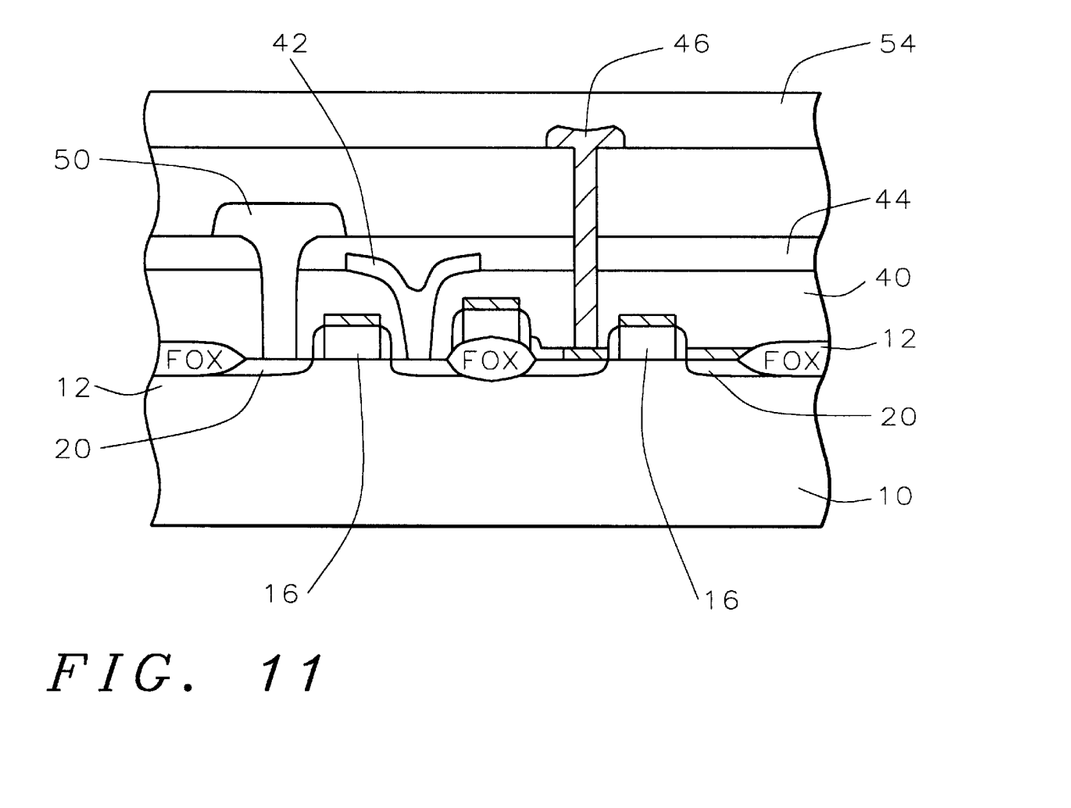
FIG. 11 is a cross-sectional representation of a completed EDRAM device fabricated by the process of the, present invention.

Processing continues as is conventional in the art to complete fabrication of the embedded DRAM device. For example, as shown in FIG. 11, an insulating layer 40 comprising silicon oxide, borophosphosilicate glass (BPSG), or the like is blanket deposited over the salicided semiconductor device structures. A contact opening is made through the insulating layer to an underlying source/drain region to be contacted, such as that in the memory area illustrated in FIG. 11. A conducting layer 42 is deposited and patterned to complete the contact and form a bit line. A second insulating layer 44 is deposited. A metal contact 46 is formed in the logic area. A capacitor node structure 50 is formed in the memory area. A passivation layer 54 completes the fabrication of the EDRAM device.

The process of the present invention provides a low-cost, easily controllable process to expose areas of the wafer for silicidation while protecting other areas. Most significantly, in the process of the present invention, a silicon oxide layer can-be etched away without damaging the underlying silicon nitride spacers. The process of the invention can be used in any application in which an underlying silicon nitride layer is to be protected while an overlying silicon oxide layer is etched. The invention is particularly useful in embedded DRAM manufacturing in which both memory and logic circuits are fabricated on the same wafer. Using the process of the invention, a silicon oxide protective layer can be left in place over the memory circuit source/drain regions and removed over the logic circuit source/drain regions and gate electrodes in both areas so that the circuits can be silicided as desired. Because the silicon nitride sidewall spacers are undamaged by the etching process of the invention, no bridging will occur.

While the invention has been particularly shown and described with reference to the preferred embodiments thereof, it will be understood by those skilled in the art that various changes in form and details may be made without departing from the spirit and scope of the invention.

What is claimed is:

1. A method of etching away a silicon oxide layer without damaging an underlying silicon nitride layer in the fabrication of an integrated circuit device comprising:

providing polysilicon gate electrodes on the surface of a semiconductor substrate;

forming silicon nitride spacers on the sidewalls of said polysilicon gate electrodes;

depositing a silicon oxide layer overlying said polysilicon gate electrodes and said silicon nitride spacers;

covering said silicon oxide layer with a photoresist layer;

developing away said photoresist layer until said silicon oxide layer overlying said polysilicon gate electrodes is exposed and remaining said photoresist layer is below the tops of said polysilicon gate electrodes;

etching away said exposed silicon oxide layer whereby the tops of said polysilicon gate electrodes are exposed and wherein said silicon nitride spacers are protected by said remaining photoresist layer and thereby undamaged by said etching;

removing said remaining photoresist layer; and completing the fabrication of said integrated circuit device.

2. The method according to claim 1 wherein said silicon oxide layer has a thickness of between 200 and 500 Angstroms.

3. The method according to claim 1 wherein said photoresist layer has a thickness of between 1300 and 2700 Angstroms.

4. The method according to claim 1 wherein said step of developing said photoresist layer is performed using trimethylammonium hydroxide (TMAH).

5. The method according to claim 1 wherein said step of etching away said exposed silicon oxide layer uses a wet etching method having a high selectivity for silicon oxide with respect to silicon nitride so that said silicon nitride spacers are undamaged by said etching step.

6. A method of fabricating an integrated circuit device comprising:

forming field oxide areas on a semiconductor substrate surrounding and electrically isolating device areas, said device areas being a logic device area and a memory device area;

providing polysilicon gate electrodes and associated source/drain regions in said device areas;

forming silicon nitride spacers on the sidewalls of said polysilicon gate electrodes;

depositing a silicon oxide layer overlying said polysilicon gate electrodes, said silicon nitride spacers, and said source/drain regions;

covering said silicon oxide layer with a photoresist layer;

developing away said photoresist layer until said silicon oxide layer overlying said polysilicon gate electrodes is exposed and remaining said photoresist layer is below the tops of said polysilicon gate electrodes;

etching away said exposed silicon oxide layer whereby the tops of said polysilicon gate electrodes are exposed and wherein said silicon nitride spacers are protected by said remaining photoresist layer and thereby undamaged by said etching;

removing said remaining photoresist layer;

thereafter forming a photoresist mask covering said memory device area;

etching away said all of silicon oxide layer not covered by said photoresist mask in said logic device area;

removing said photoresist mask;

thereafter depositing a layer of titanium over said semiconductor substrate;

annealing said semiconductor substrate whereby said titanium layer is transformed into a titanium silicide layer over said gate electrodes and over said source/drain regions in said logic area not covered by said silicon oxide layer; and removing said titanium layer which is not transformed into titanium silicide overlying said spacers, said field oxide regions, and said silicon oxide layer to leave said titanium silicide layer only on the top surface of said gate electrodes and on the top surface of said semiconductor substrate overlying said source/drain regions associated with said gate electrodes in said logic device area to complete fabrication of said integrated circuit device.

7. The method according to claim 6 wherein said silicon oxide layer has a thickness of between about 200 and 500 Angstroms and wherein said silicon oxide prevents silicidation from occurring in said memory device area.

8. The method according to claim 6 wherein said photoresist layer has a thickness of between 1300 and 2700 Angstroms.

9. The method according to claim 6 wherein said step of developing said photoresist layer is performed using trimethylammonium hydroxide (TMAH).

10. The method according to claim 6 wherein said step of etching away said exposed silicon oxide layer uses a wet etching method having a high selectivity for silicon oxide with respect to silicon nitride so that said silicon nitride spacers are undamaged by said etching step.

11. The method according to claim 6 wherein said titanium layer comprises titanium nitride.

12. The method according to claim 6 wherein said titanium layer comprises titanium and titanium nitride.

13. The method according to claim 6 wherein said annealing is a rapid thermal anneal (RTA) performed in a nitrogen ambient at a temperature of between about 750 and 850° C. for between about 20 to 40 seconds.

14. A method of fabricating an integrated circuit device wherein a logic device area and a memory device area are fabricated on the same wafer comprising:

forming field oxide areas on a semiconductor substrate surrounding and electrically isolating said device areas, said device areas being said logic device area and said memory device area;

providing polysilicon gate electrodes and associated source/drain regions in said device areas;

forming silicon nitride spacers on the sidewalls of said polysilicon gate electrodes;

depositing a silicon oxide layer overlying said polysilicon gate electrodes, said silicon nitride spacers, and said source/drain regions;

covering said silicon oxide layer with a photoresist layer;

developing away said photoresist layer until said silicon oxide layer overlying said polysilicon gate electrodes is exposed and remaining said photoresist layer is below the tops of said polysilicon gate electrodes;

etching away said exposed silicon oxide layer whereby the tops of said polysilicon gate electrodes are exposed wherein said etching step has a high selectivity for silicon oxide with respect to silicon nitride whereby said silicon nitride spacers are protected by said remaining photoresist layer and thereby undamaged by said etching;

removing said remaining photoresist layer;

thereafter forming a photoresist mask covering said memory device area;

etching away said all of silicon oxide layer not covered by said photoresist mask in said logic device area;

removing said photoresist mask;

thereafter depositing a layer of titanium over said semiconductor substrate;

annealing said semiconductor substrate whereby said titanium layer reacts with the polysilicon in said polysilicon gate electrodes and said silicon in said semiconductor substrate in said source/drain regions in said logic area not covered by said silicon oxide layer to form a titanium silicide layer and wherein said titanium layer overlying said spacers, said field oxide regions, and said silicon oxide layer is unreacted; and removing said unreacted titanium layer leaving said titanium silicide layer only on the top surface of said gate electrodes and on the top surface of said semiconductor substrate overlying said source/drain regions associated with said gate electrodes in said logic device area to complete fabrication of said integrated circuit device.

15. The method according to claim 14 wherein said silicon oxide layer has a thickness of between 200 and 5000 Angstroms and wherein said silicon oxide prevents silicidation from occurring in said memory device area.

16. The method according to claim 14 wherein said photoresist layer has a thickness of between 1300 and 2700 Angstroms.

17. The method according to claim 14 wherein said step of developing said photoresist layer is performed using trimethylammonium hydroxide (TMAH).

18. The method according to claim 14 wherein said step of etching away said exposed silicon oxide layer uses a wet etching method.

19. The method according to claim 14 wherein said titanium layer comprises titanium nitride.

20. The method according to claim 14 wherein said titanium layer comprises titanium and titanium nitride.

21. The method according to claim 17 wherein said annealing is a rapid thermal anneal (RTA) performed in a nitrogen ambient at a temperature of between 750 and 850° C. for between about 20 to 40 seconds.

* * * * *